(12) United States Patent
Schrödinger et al.

(10) Patent No.: US 7,391,797 B2
(45) Date of Patent: Jun. 24, 2008

(54) INTEGRATED CIRCUIT FOR CONTROLLING A LASER DIODE

(75) Inventors: Karl Schrödinger, Berlin (DE); Toralf Oheim, Hennigsdorf (DE)

(73) Assignee: Finisar Corporation, Sunnyvale, CA (US)

( * ) Notice: Subject to any disclaimer, the term of this patent is extended or adjusted under 35 U.S.C. 154(b) by 427 days.

(21) Appl. No.: 10/487,763

(22) PCT Filed: Nov. 21, 2001

(86) PCT No.: PCT/DE01/04423

§ 371 (c)(1),
(2), (4) Date: Sep. 23, 2004

(87) PCT Pub. No.: WO03/036770

PCT Pub. Date: May 1, 2003

(65) Prior Publication Data

US 2005/0025201 A1  Feb. 3, 2005

(30) Foreign Application Priority Data

Sep. 14, 2001  (WO)  ............... PCT/DE01/03606
Nov. 2, 2001  (WO)  ............... PCT/DE01/04175

(51) Int. Cl.
*H01S 3/10* (2006.01)
*H01S 3/00* (2006.01)
(52) U.S. Cl. ............... 372/38.02; 372/38.07; 372/26
(58) Field of Classification Search ............... 372/38.02, 372/38.07, 26
See application file for complete search history.

(56) References Cited

U.S. PATENT DOCUMENTS 5,274,490 A * 12/1993 Tsushima et al. ........... 398/204
5,347,529 A *  9/1994 Noe ........................... 372/28
5,422,752 A *  6/1995 Hardcastle ................. 398/187
5,471,492 A   11/1995 Pidgeon, Jr. et al.
5,539,761 A    7/1996 Golub et al.

(Continued)

FOREIGN PATENT DOCUMENTS

JP       59061193       4/1984

OTHER PUBLICATIONS

International Search Report, International Application No. PCT/DE01/04423, International Filing Date Nov. 21, 2001, 3 pgs.

*Primary Examiner*—Minsun Harvey
*Assistant Examiner*—Marcia A. Golub
(74) *Attorney, Agent, or Firm*—Workman Nydegger

(57) ABSTRACT

The invention relates to an integrated circuit for controlling a laser diode, comprising a signal input for receiving a data signal; a signal output for connection to the laser diode; a modulator for modulation of the data signal; a current infeed connected to the signal output for the supply of a bias current; a coupling capacitor between the output of the modulator and the signal output in order to form a high pass with the differential resistor of the laser diode. Preferably, the circuit also comprises an active compensation circuit with a low pass connected to the output of the modulator; and a circuit which is connected to the low pass for producing a signal which is inversely proportional to the low pass output voltage and which is added to the output signal or subtracted from the output signal. The low pass can be controlled by a circuit guiding the data signal.

5 Claims, 6 Drawing Sheets

U.S. PATENT DOCUMENTS 5,638,390 A * 6/1997 Gilliland et al. ........ 372/29.011
5,784,091 A    7/1998 Ema et al.
5,883,910 A    3/1999 Link
6,862,379 B2 * 3/2005 Howley ....................... 385/14

* cited by examiner

INTEGRATED CIRCUIT FOR CONTROLLING A LASER DIODE

RELATED APPLICATION

This application claims priority to and incorporates by reference International Application No. PCT/DE01/04423 filed Nov. 21, 2001, which is entitled "Integrated Circuit for Controlling a Laser Diode", which was not published in English, which claims priority to PCT/DE01/03606, which is entitled, "Integrated Circuit for Controlling a Laser Diode", filed on Sep. 14, 2001 and PCT/DE01/04175, which is entitled "Integrated Circuit for Controlling a Laser Diode", filed on Nov. 2, 2001, which are hereby incorporated by reference in their entirety.

FIELD OF THE INVENTION

The present invention relates to an integrated circuit for controlling a laser diode, an integrated circuit for differentially controlling a laser diode, and also to an integrated circuit for controlling a laser diode array having a multiplicity of laser diodes.

BACKGROUND OF THE INVENTION

In order to achieve power losses that are as small as possible integrated circuits (ICs) for controlling laser diodes are being developed for ever decreasing supply voltages. Breakdown criteria of many of the integrated components used constitute a further motivation for smaller supply voltages.

The operating point of the laser diode to be controlled is set by a threshold current and a modulation current, the modulation current representing the datastream. The currents generate a voltage drop across the laser diode. The voltage drop across the diode may be so large that the laser can no longer be driven directly by the laser driver IC on account of the limiting supply voltage.

If the voltage drop across the laser diode is so large that the laser can no longer be driven directly by the laser driver IC on account of the limited supply voltage or the necessary voltage drops across the driver transistors, then it is known to allow the modulation of the laser diode to be effected by means of a coupling capacitance. During the modulation and transmission of the data in the radio frequency range, however, losses and mismatches due to parasitic elements occur on the coupling paths both from the modulation output of the laser driver IC to the coupling capacitor and from the coupling capacitor to the laser diode coupling unit. These parasitic elements may be, inter alia, bonding wire inductances and pad capacitances.

SUMMARY OF THE INVENTION

The invention provides an integrated circuit for controlling a laser diode, having: a signal input for receiving a data signal; a signal output for connection to the laser diode; a modulator for modulation of the data signal; a current infeed connected to the signal output and serving for the supply of a bias current; and a coupling capacitor between the output of the modulator and the signal output, for forming a high-pass filter with the resistor of the laser diode connected to the signal output.

Integrating the coupling capacitance into the laser driver IC reduces the number of problematic coupling paths from the modulation output of the laser driver IC to the laser diode coupling unit. The first coupling path between the modulation output of the laser driver IC and the external coupling capacitance is thus obviated. This advantage can be utilized for a single and a differential control of the laser diode.

In one refinement, the integrated circuit has an active compensation circuit, having a low-pass filter connected to the output of the modulator and a circuit connected to the low-pass filter and serving for generating a signal which is inversely proportional to the low-pass filter output voltage. This circuit is connected to the signal output in such a way that the signal which is inversely proportional to the low-pass filter output voltage is subtracted from the output signal. The low-pass filter may be controllable by a circuit carrying the data signal.

In one refinement, the integrated circuit has an active compensation circuit, having a low-pass filter connected to the output of the modulator and a circuit connected to the low-pass filter and serving for generating a signal which is proportional to the low-pass filter output voltage. This circuit is connected to the signal output in such a way that the signal which is proportional to the low-pass filter output voltage is added to the output signal. The low-pass filter may be controllable by a circuit carrying the data signal.

In another refinement, the integrated circuit comprises an active compensation circuit having: a low-pass filter connected to the output of the modulator, a voltage inverter connected to the low-pass filter and serving for inverting the voltage generated by the low-pass filter in accordance with the low-pass filter transfer function; a voltage follower connected to the output of the voltage inverter; and a converter between the output of the voltage follower and the signal output, for generating a current which is inversely proportional to the low-pass filter output voltage.

This refinement has the following advantage: the coupling capacitance forms a high-pass filter with the differential resistor of the laser diode. In this case, time constants that are as large as possible are necessary for a broadband data transmission. The lower bandwidth limitation is determined by the definition of the time constant of the high-pass filter. Since the differential resistor of the laser diode is predetermined, the value of the coupling capacitance must be chosen to be correspondingly large. However, large capacitances in ICs take up large areas on ICs in accordance with the capacitance per unit area and they have a harmful capacitance with respect to the substrate (ground).

The active compensation circuit now makes it possible to be able to reduce the integrated capacitance with the lower bandwidth limitation remaining the same. To put it another way, the lower bandwidth limitation is extended with the integrated capacitance remaining the same through the application of the compensation circuit.

The invention additionally provides an integrated circuit for differentially controlling a laser diode, having a signal input for receiving a data signal; a first signal output for connection to the anode of the laser diode; a second signal output for connection to the cathode of the laser diode; a modulator for modulating the data signal; a bias current supply connected to the cathode; a reference-ground potential connected to the anode; a first and a second coupling capacitor between a first and second output, respectively of the modulator and the first and second signal output, respectively; and a first and a second compensation circuit connected in parallel with the first and second coupling capacitors, respectively, the first and second compensation circuits in each case having a low-pass filter, which is connected to the first and second output, respectively, of the modulator and can be controlled by a circuit carrying the data signal; and a circuit connected to the low-pass filter and serving for generating a signal which is inversely proportional and proportional, respectively, to the low-pass filter output voltage, which signal is subtracted from the output signal and, respectively, added to the output signal.

Depending on the refinement the cathode is inductively isolated from the reference-ground potential, or internally coupled to the reference-ground potential. Equally, the anode may be inductively isolated from the bias current supply, or internally coupled to the bias current supply.

The invention furthermore provides an integrated circuit for controlling a laser diode array having a multiplicity of laser diodes, having; a supply voltage feed; one or a plurality of signal inputs for receiving data signals; a multiplicity of signal outputs for connection to the laser diodes, a signal output (in single or differential embodiment) in each case being assigned to a laser diode; a multiplicity of modulation stages for modulating the data signals, a modulation stage in each case being assigned to a signal output; and a respective coupling capacitor between the output of one of the modulation stages and the assigned signal output, for the formation of a high-pass filter together with the differential resistor of the assigned laser diode.

The use of integrated coupling capacitors is particularly advantageous when operating a laser diode array (arrangement of a plurality of laser diodes with a mechanical interconnection) by means of a laser driver IC with a plurality of modulation outputs. An enlarged printed circuit board construction is necessary when using external coupling capacitances in a known manner. The integrated coupling capacitance of each modulation stage makes this unnecessary, however.

It is thus possible for the modulation outputs of the laser driver ICs to be directly connected to the laser diode coupling unit or the laser diode array, for example by means of bonding wires.

In one refinement, an active compensation circuit is connected in parallel with each coupling capacitor, having: a low-pass filter connected to the output of the assigned modulation stage; and a circuit connected to the low-pass filter and serving for generating a signal which is inversely proportional to the low-pass filter output voltage. This circuit is connected to the respective signal output in such a way that the signal which is inversely proportional to the low-pass filter output voltage is subtracted from the respective output signal. Each low-pass filter may be controllable by a circuit carrying the respectively assigned data signal.

In another refinement, an active compensation circuit is connected in parallel with each coupling capacitor, having: a low-pass filter connected to the output of the assigned modulation stage; and a circuit connected to the low-pass filter and serving for generating a signal which is proportional to the low-pass filter output voltage. This circuit is connected to the respective signal output in such a way that the signal which is proportional to the low-pass filter output voltage is added to the respective output signal. Each low-pass filter may be controllable by a circuit carrying the respectively assigned data signal.

In another refinement, an active compensation circuit is connected in parallel with each coupling capacitor, having: a low-pass filter connected to the output of the assigned modulation stage; a voltage inverter connected to the low-pass filter and serving for inverting the voltage generated by the low-pass filter in accordance with the low-pass filter transfer function; a voltage follower connected to the output of the voltage inverter; and a converter between the output of the voltage follower and the assigned signal output, for generating a current which is inversely proportional to the low-pass filter output voltage.

The integrated circuit according to the invention may be employed in a laser driver IC for a 10 Gbit/s data transmission, which drives a VCSEL (Vertical Cavity Surface Emitting Laser) and operates with a supply voltage of 3.3 V.

Furthermore, the integrated circuit according to the invention may be employed in a 10 Gbit/s laser driver IC having a plurality of modulation outputs, which drives a VCSEL array and operates with a supply voltage of 3.3 V. For comparison: known 10 Gbit/s laser driver ICs operate only with supply voltages of 5 V.

BRIEF DESCRIPTION OF THE DRAWINGS

Exemplary embodiments of the integrated circuit according to the invention are illustrated with reference to the figures, in which.

DETAILED DESCRIPTION OF THE INVENTION

Figure 1:
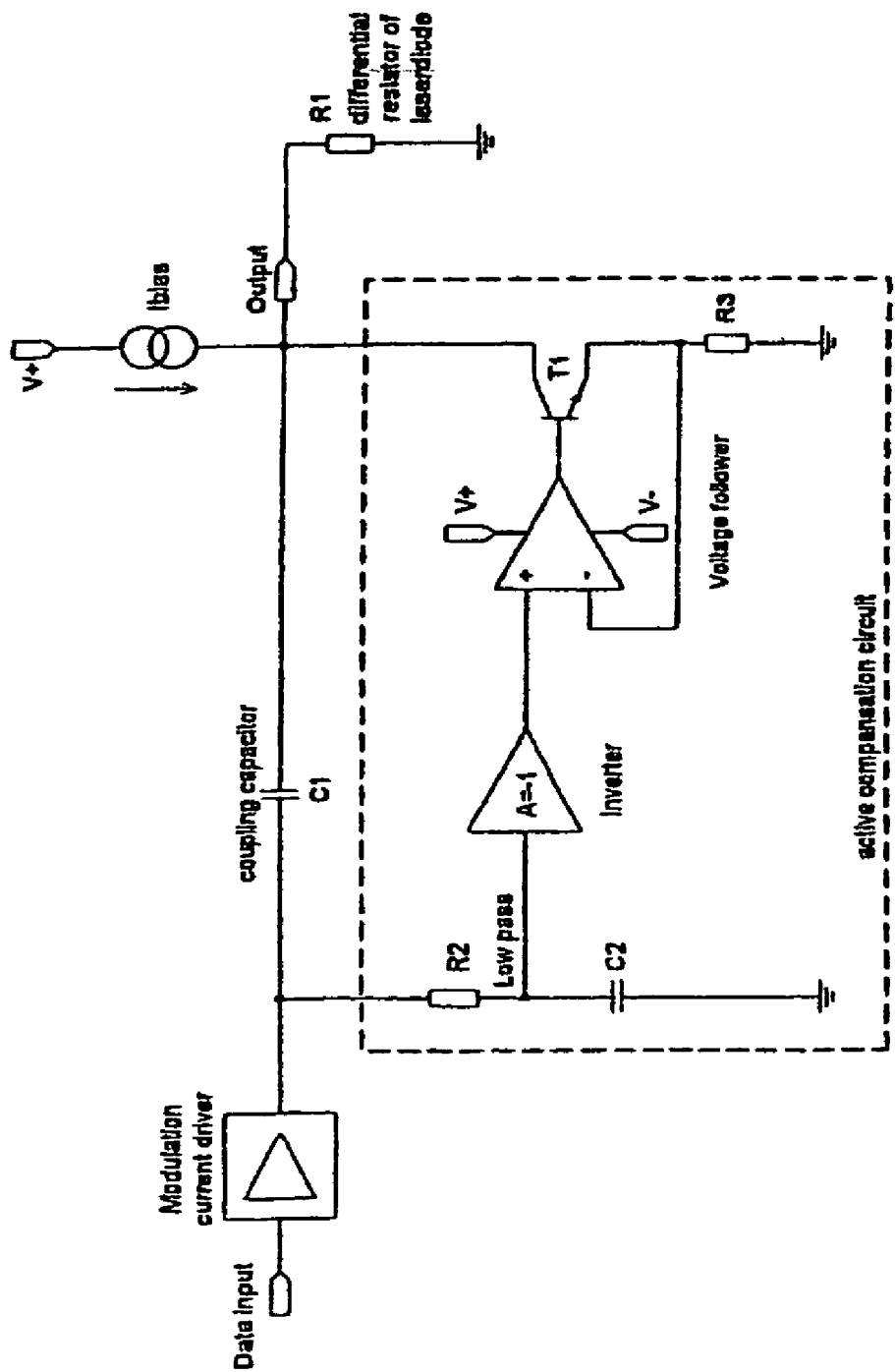
FIG. 1 shows a basic circuit diagram of an exemplary embodiment of the invention.

FIG. 1 shows a basic circuit diagram of an exemplary embodiment of the invention, having an active compensation circuit for expanding the lower bandwidth limitation of the high-pass filter. The high-pass filter at the modulation current driver output is formed by the integrated coupling capacitance C1 and the differential resistor R1 of the laser diode. C1 and R1 form the time constant $\tau 1 = R1*C1$.

The active compensation circuit illustrated in FIG. 1 comprises a low-pass filter, a voltage inverter, and a voltage follower with downstream voltage-current conversion. The mechanism of action is as follows: the low-pass filter, comprising R2 and C2, filters the high frequencies out of the data signal in accordance with its time constant $\tau 2 = R2*C2$. An output voltage is produced in accordance with the low-pass filter transfer function, which output voltage is inverted with the aid of the inverter. A current which is inversely proportional to the low-pass filter output signal is generated from the inverter output signal by the voltage follower with downstream voltage-current conversion at R3. This output current of the compensation circuit is subtracted from the output current flowing through C1. Given a suitable choice of the magnitudes of R2, C2 and R3, the output current of the compensation circuit compensates for the band-limiting influence of the high-pass filter (R1, C1) on the lower frequency components of the data signal; i.e. the signals absent downstream of the capacitor C1 (frequency components $fg1 < (2\pi \tau 1)$) are added again by the active compensation circuit.

Figure 2:
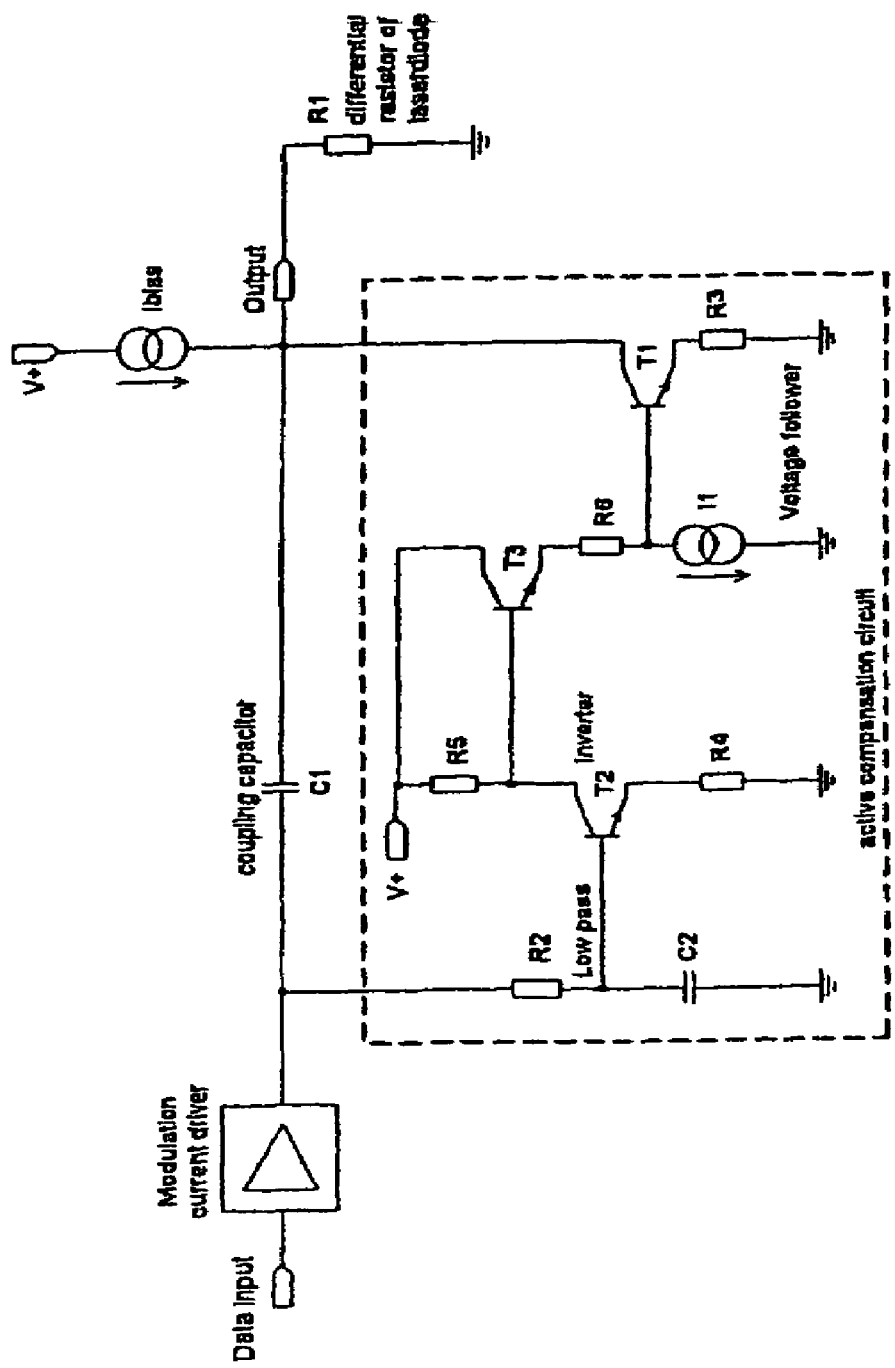
FIG. 2 shows an example of the realization of an active compensation circuit.

FIG. 2 shows an example of the realization of the active compensation circuit (here with a single-ended output driver) for expanding the lower bandwidth limitation of the high-pass filter formed from C1 and R1. The low-pass filter comprises R2 and C2. The inverter is realized by the common emitter connection T2, R4 and R5. The voltage follower with downstream voltage-current conversion comprises the elements T3, R6, I1, T1 and R3.

Figure 3:
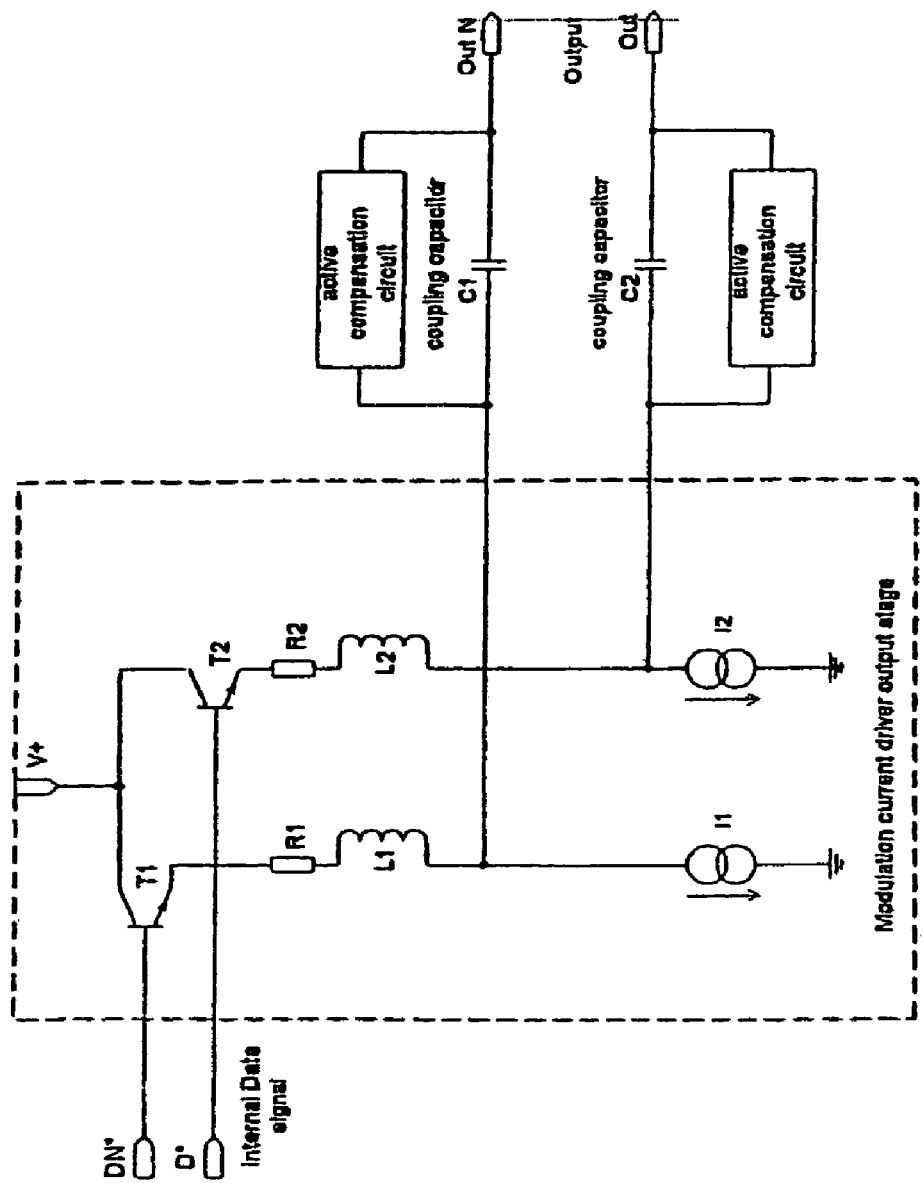
FIG. 3 shows an example of the realization of a modulation current output driver.

FIG. 3 shows an example of the realization of the modulation output driver (here as a differential circuit). T1 and T2 operate in common collector connection on the integrated coupling capacitances C1 and C2. The resistors R1 and R2 operate as attenuation resistors. L1 and L2 serve to compensate for parasitic capacitances. The active compensation circuits are connected in parallel with the integrated coupling capacitances.

Figure 4:
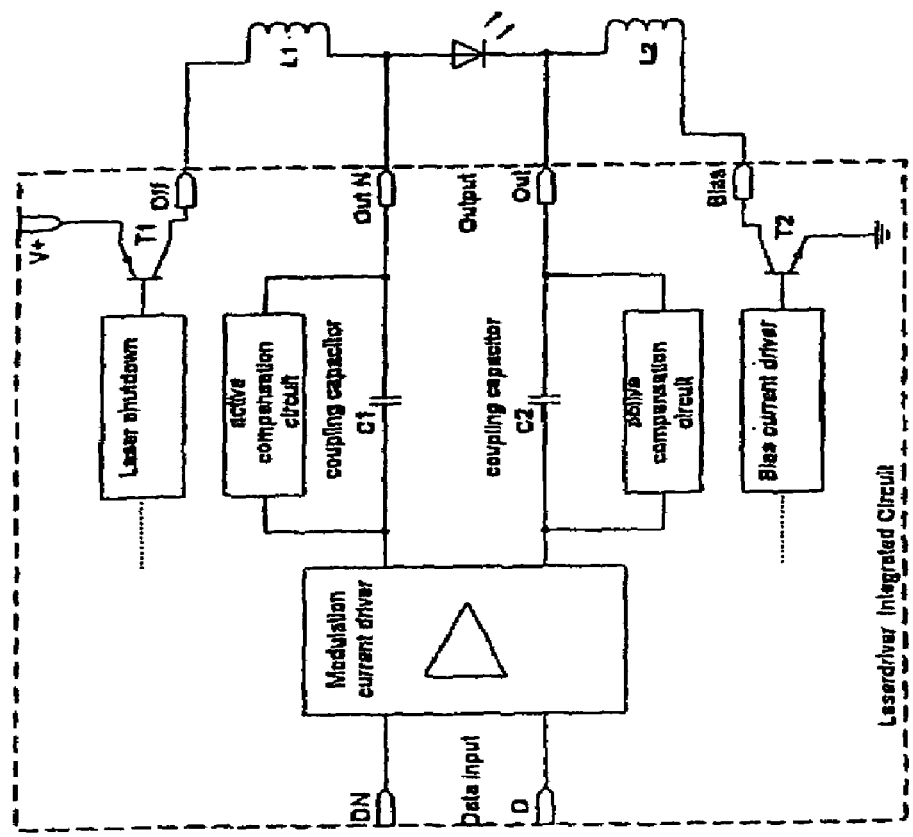
FIG. 4 shows a circuit diagram according to a first coupling example of a laser driver output and a laser diode.
Figure 5:
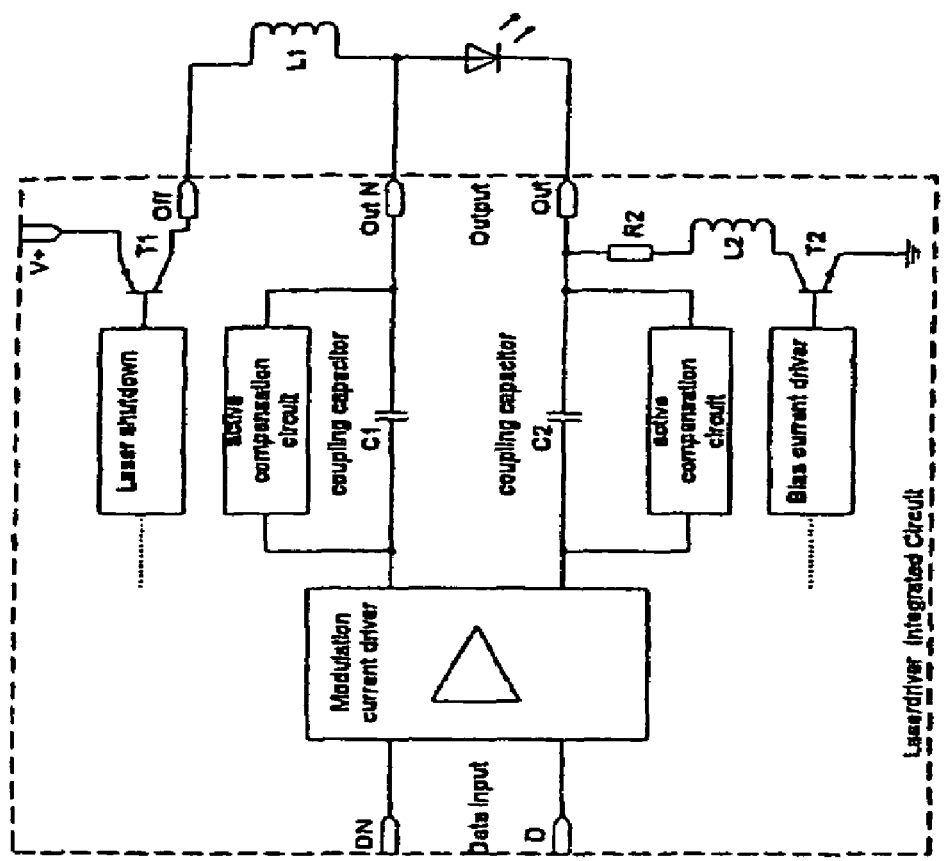
FIG. 5 shows a circuit diagram according to a second coupling example of a laser driver output and a laser diode.
Figure 6:
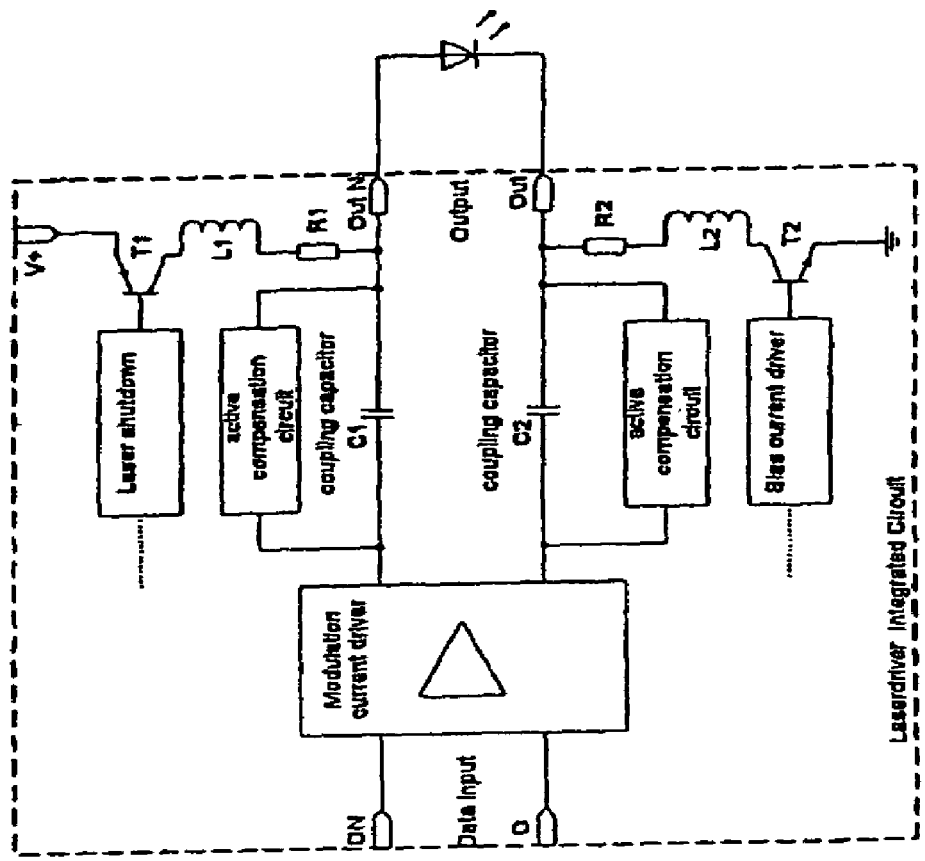
FIG. 6 shows a circuit diagram according to a third coupling example of a laser driver output and a laser diode.

FIGS. 4 to 6 show the application of the active compensation circuit in various coupling forms for the laser driver output and the laser diode. FIG. 4 shows a differential control of the laser diode with inductive isolation from the bias current supply and the reference-ground potential. FIG. 5 shows a differential control of the laser diode with an internal bias current supply and inductive isolation from the reference-ground potential. FIG. 6 likewise shows a differential control of the laser diode with internal coupling to the bias current supply and to the reference-ground potential.

It should be noted that the invention is not restricted to the exemplary embodiment described, but rather encompasses modifications within the scope of protection defined by the claims.

The invention claimed is:

1. An integrated circuit for controlling a laser diode, having:
   a signal input for receiving a data signal;
   a signal output for connection to the laser diode;
   a modulator for modulation the data signal, wherein the modulator has a first node coupled to the signal input node such that the data signal is modulated by the modulator after being received by the signal input node;
   a current infeed connected to the signal output node and serving for the supply of a bias current;
   a coupling capacitor having a first terminal coupled to a second node of the modulator and a second terminal coupled to the signal output node, for forming a high-pass filter with the differential resistor of the laser diode connected to the signal output node, and
   an active compensation circuit having:
      a low-pass filter connected to the output of the modulator,
      a voltage inverter connected to the low-pass filter and serving for inverting the voltage generated by the low-pass filter in accordance with the low-pass filter transfer function;
      a voltage follower connected to the output of the voltage inverter; and
      a converter between the output of the voltage follower and the signal output, for generating a current which is inversely proportional to the low-pass filter output voltage.

2. The integrated circuit as claimed in claim 1, the low-pass filter being controlled by a circuit carrying the data signal.

3. An integrated circuit for controlling a laser diode, having:
   a signal input for receiving a data signal;
   a signal output for connection to the laser diode;
   a modulator for modulation the data signal;
   a current infeed connected to the signal output and serving for the supply of a bias current;
   a coupling capacitor between the output of the modulator and the signal output, for forming a high-pass filter with the differential resistor of the laser diode connected to the signal output; and
   an active compensation circuit having:
      a low-pass filter connected to the output of the modulator,
      a voltage inverter connected to the low-pass filter and serving for inverting the voltage generated by the low-pass filter in accordance with the low-pass filter transfer function;
      a voltage follower connected to the output of the voltage inverter; and
      a converter between the output of the voltage follower and the signal output, for generating a current which is inversely proportional to the low-pass filter output voltage.

4. The integrated circuit as claimed in claim 3, wherein the laser diode is a VCSEL.

5. The integrated circuit as claimed in claim 1, wherein the laser diode is a VCSEL.

* * * * *